(12) United States Patent
Kang et al.

(10) Patent No.: US 10,665,702 B2
(45) Date of Patent: May 26, 2020

(54) VERTICAL BIPOLAR TRANSISTORS

(71) Applicant: Samsung Electronics Co., Ltd., Suwon-si, Gyeonggi-do (KR)

(72) Inventors: Myung Gil Kang, Suwon-si (KR); Ill Seo Kang, Eumseong-gun (KR); Yong Hee Park, Hwaseong-si (KR); Sang Hoon Baek, Seoul (KR); Keon Yong Cheon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/151,511

(22) Filed: Oct. 4, 2018

(65) Prior Publication Data

US 2019/0198648 A1    Jun. 27, 2019

Related U.S. Application Data

(60) Provisional application No. 62/610,625, filed on Dec. 27, 2017.

(51) Int. Cl.
*H01L 29/66* (2006.01)
*H01L 29/732* (2006.01)
(Continued)

(52) U.S. Cl.
CPC ...... *H01L 29/732* (2013.01); *H01L 21/28088* (2013.01); *H01L 21/3086* (2013.01); *H01L 21/8249* (2013.01); *H01L 27/0623* (2013.01); *H01L 27/0826* (2013.01); *H01L 29/0646* (2013.01); *H01L 29/0804* (2013.01); *H01L 29/0821* (2013.01); *H01L 29/0843* (2013.01); *H01L 29/1004* (2013.01); *H01L 29/4966* (2013.01); *H01L 29/517* (2013.01); *H01L 21/823885* (2013.01)

(58) Field of Classification Search
CPC ........... H01L 21/28088; H01L 21/3086; H01L 27/0826; H01L 29/0646; H01L 29/0804; H01L 29/732
USPC .............................. 257/197, 273, 511, 565
See application file for complete search history.

(56) References Cited

U.S. PATENT DOCUMENTS 7,834,403 B2    11/2010    Kakoschke et al.
7,939,416 B2    5/2011    Nuttinck et al.
(Continued)

FOREIGN PATENT DOCUMENTS

CN    104022032 A    9/2014

*Primary Examiner* — Tan N Tran
(74) *Attorney, Agent, or Firm* — Harness, Dickey & Pierce, P.L.C.

(57) ABSTRACT

A vertical bipolar transistor including a substrate including a first well of a first conductivity type and a second well of a second conductivity type different from the first conductivity type, the first well adjoining the second well, a first fin extending, from the first well, a second fin extending from the first well, a third fin extending from the second well, a first conductive region on the first fin, having the second conductivity type and configured to serve as an emitter of the vertical bipolar transistor, a second conductive region on the second fin, having the first conductivity type, and configured to serve as a base of the vertical bipolar transistor, and a third conductive region on the third fin, having the second conductivity type, and configured to serve as a collector of the vertical bipolar transistor may be provided.

20 Claims, 16 Drawing Sheets

(51) Int. Cl.
*H01L 27/082* (2006.01)
*H01L 29/06* (2006.01)
*H01L 29/08* (2006.01)
*H01L 21/28* (2006.01)
*H01L 29/49* (2006.01)
*H01L 29/51* (2006.01)
*H01L 21/308* (2006.01)
*H01L 29/10* (2006.01)
*H01L 27/06* (2006.01)
*H01L 21/8249* (2006.01)
*H01L 21/8238* (2006.01)

(56) References Cited

U.S. PATENT DOCUMENTS

| | | |
|---|---|---|
| 8,183,613 B2 | 5/2012 | Jeong et al. |
| 8,373,229 B2 | 2/2013 | Chen et al. |
| 8,455,947 B2 | 6/2013 | Shrivastava et al. |
| 8,610,241 B1 * | 12/2013 | Hu .................. H01L 27/0629 257/353 |
| 8,617,957 B1 | 12/2013 | Chang et al. |
| 8,703,571 B2 | 4/2014 | Ke et al. |
| 9,035,426 B2 | 5/2015 | Chang et al. |
| 9,312,371 B2 | 4/2016 | Singh |
| 9,419,087 B2 | 8/2016 | Hu et al. |
| 9,461,036 B2 | 10/2016 | Suzuki |
| 9,728,530 B1 | 8/2017 | Ker et al. |
| 2015/0236116 A1 * | 8/2015 | Chang .............. H01L 29/6625 438/338 |
| 2017/0062564 A1 | 3/2017 | Zhou |
| 2017/0117326 A1 | 4/2017 | Boivin et al. |

\* cited by examiner

VERTICAL BIPOLAR TRANSISTORS

CROSS-REFERENCE TO RELATED APPLICATION

This non-provisional application claims priority from U.S. Provisional Patent Application No. 62/610,625 filed on Dec. 27, 2017 in the U.S. Patent and Trademark Office, and all the benefits accruing therefrom under 35 U.S.C. 119, the contents of which are incorporated herein by reference in its entirety.

BACKGROUND

1. Field

Some example embodiments of the inventive concepts disclosed herein relate to vertical bipolar transistors, more specifically to vertical bipolar transistors compatible with vertical field effect transistor manufacturing processes.

2. Description of the Related Art

A vertical field effect transistor (VTFET) has been extensively studied as a desirable alternative for a fin field effect transistor (FinFET) because of, for example, its improved scalability and a relatively lower middle-of-line (MOL) capacitance. However, a VTFET still has many issues to be solved in terms of, for example, strain engineering, variation control, and application to power devices.

Because a VTFET defines a channel along a vertical direction, conventionally, additional process steps are used to provide a vertical bipolar transistor. Accordingly, there is a desire for a relatively simple structure of a bipolar transistor, which can be fabricated without introducing additional process steps.

SUMMARY

Some example embodiments of the inventive concepts provide vertical bipolar transistors.

Some example embodiments of the inventive concepts provide vertical bipolar transistors, which can be manufactured while forming vertical field effect transistors without introducing additional process steps.

According to an example embodiment of the inventive concepts, a vertical bipolar transistor may include a substrate including a first well of a first conductivity type and a second well of a second conductivity type, the second conductivity type being different from the first conductivity type, the first well adjoining the second well, a first fin extending from the first well, the first fin including a first conductive region at a top portion thereof, the first conductive region having the second conductivity type and configured to serve as an emitter of the vertical bipolar transistor, a second fin extending from the first well and spaced apart from the first fin, the second fin including a second conductive region at a top portion thereof, the second conductive region having the first conductivity type and configured to serve as a base of the vertical bipolar transistor, and a third fin extending from the second well, the third fin including a third conductive region at a top portion thereof, the third conductive region having the second conductivity type and configured to serve as a collector of the vertical bipolar transistor.

According to an example embodiment of the inventive concepts, a vertical bipolar transistor may include a substrate including a first well of a first conductivity type and a second well of a second conductivity type, the second conductivity type being different from the first conductivity type, the first well adjoining the second well, a first conductive region in the first well, the first conductive region having the second conductivity type, the first conductive region configured to serve as a emitter of the vertical bipolar transistor, a first fin extending from the first well of the substrate, the first fin laterally spaced apart from the first conductive region, the first fin including a second conductive region at a top portion thereof, the second conductive region having the first conductivity type, a second fin extending from the second well of the substrate, the second fin including a third conductive region at a top portion thereof, the third conductive region having the second conductivity type, at least one sub-base region in the first well, the at least one sub-base region having the first conductivity type, the at least one sub-base region aligned with respect to the first fin and laterally spaced apart from the first conductive region, the second conductive region and the at least one sub-base region collectively configured to serve as a base of the vertical bipolar transistor, and at least one sub-collector region in the second well, the at least one sub-collector region having the second conductivity type, the at least one sub-collector region aligned with respect to the second fin and laterally spaced apart from the at least one sub-base region, the third conductive region and the at least one sub-collector region collectively configured to serve as a collector of the vertical bipolar transistor.

According to an example embodiment of the inventive concepts, a vertical bipolar transistor may include a first fin and a second fin extending from a first well of a substrate, the first well having a first conductivity type, the first fin and the second fin being spaced apart from each other, the first fin including a first conductive region having a second conductivity type at a top portion thereof, the second fin including a second conductive region having the first conductivity type at a top portion thereof, the first and second conductivity types being opposite to each other, a third fin extending from a second well of the substrate, the second well having a second conductivity type, the second well adjoining the first well, the third fin including a third conductive region having the second conductivity type at a top portion thereof, an emitter region of the vertical bipolar transistor including the first conductive region, and at least one sub-emitter region in the first well and having the second conductivity type, the at least one sub-emitter region laterally aligned with respect to the first fin, the first conductive region and the at least one sub-emitter region collectively configured to serve as an emitter of the vertical bipolar transistor, a base region of the vertical bipolar transistor including the second conductive region, and at least one sub-base region in the first well and having the first conductivity type, the at least one sub-base region laterally aligned with respect to the second fin, the second conductive region and the at least one sub-base region collectively configured to serve as a base of the vertical bipolar transistor, and a collector region of the vertical bipolar transistor including the third conductive region, and at least one sub-collector region in the second well and having the second conductivity type, the at least one sub-collector region laterally aligned with respect to the third fin, the third conductive region and the at least one sub-collector region collectively configured to serve as a collector of the vertical bipolar transistor.

BRIEF DESCRIPTION OF THE DRAWINGS

The above and other objects, features and effects of inventive concepts will become more apparent to those of ordinary skill in the art by describing in detail example embodiments thereof with reference to the accompanying drawings, in which.

DETAILED DESCRIPTION

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. (Expressions such as "at least one of," when preceding a list of elements, modify the entire list of elements and do not modify the individual elements of the list.)

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, some example embodiments of the present inventive concepts will be explained with reference to the accompanying drawings. The present inventive concepts will be described using a vertical PNP bipolar transistor as an example. However, example embodiments are not limited thereto. Thus, a vertical NPN bipolar transistor also can be obtained according to the present inventive concepts.

Figure 1:
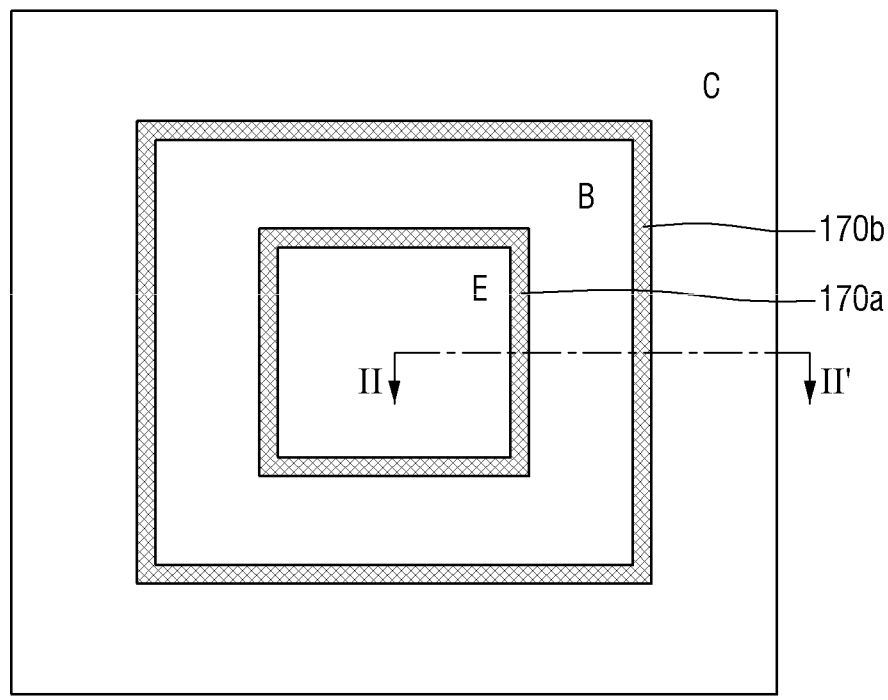
FIG. 1 shows a conceptual plan view of a vertical bipolar transistor including an emitter E, a base B, and a collector C, according to an example embodiment.

FIG. 1 shows a conceptual plan view of a vertical bipolar transistor 100 including an emitter E, a base B, and a collector C, according to an example embodiment. The vertical bipolar transistor 100 may include a first isolation region 170a between the emitter E and the base B and a second isolation region 170b between the base B and the collector C.

If such a bipolar transistor is formed by a planar process, the bipolar transistor may have a relatively good junction characteristic at a junction provided between the emitter E and the base B and at a junction between the base B and the collector C. However, methods of forming such a planar bipolar transistor may not be compatible with methods of forming a vertical (e.g., three-dimensional) field effect transistor (e.g., VTFET), and thus may need additional processes.

Figure 2:
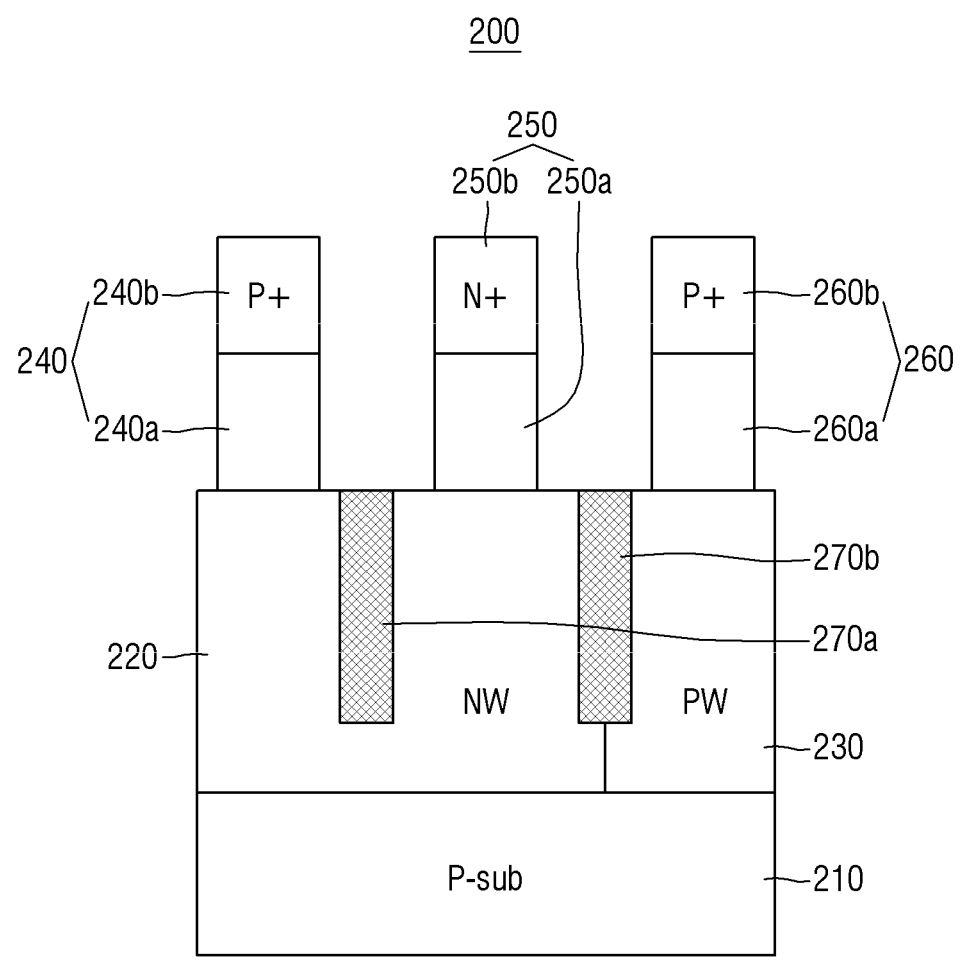
FIG. 2 is a cross-sectional view of a vertical PNP bipolar transistor, taken along line II-II' of FIG. 1, according to an example embodiment of the inventive concepts.

FIG. 2 is a cross-sectional view of a vertical PNP bipolar transistor 200, taken along line II-II' of FIG. 1, according to an example embodiment of the inventive concepts.

Referring to FIG. 2, a semiconductor substrate 210 may be a semiconductor substrate doped with p-type impurities. Hereinafter, the semiconductor substrate 210 and a p-type substrate (as an example) will be interchangeably used throughout the disclosure. The semiconductor substrate 210 may be a portion of a bulk silicon wafer. The semiconductor substrate 210 may be a silicon portion of a Silicon-On-Insulator (SOI) wafer. The semiconductor substrate 210 may include a material other than silicon, including but not limited to Ge, SiGe, SiC, GeP, GeN, InGaAs, GaAs, InSb, InAs, GaSb, and InP. The semiconductor substrate 210 may refer to a semiconductor layer epitaxially grown on a base substrate.

The p-type substrate 210 may be provided with an n-well region 220 and a p-well region 230 adjacent to the n-well region 220. The p-type substrate 210 may be provided with a plurality of fins, which includes a first fin 240, a second fin 250, and a third fin 260 (collectively referred to as fins). The first and second fins 240 and 250 may protrude from the n-well region 220, and may be spaced apart from each other. The third fin 260 may protrude from p-well region 230.

In some example embodiments, the first, second, and third fins 240, 250, and 260 may be formed by performing photolithography and etching process with regard to the semiconductor substrate 210. In some other example embodiments, the first, second, and third fins 240, 250, and 260 may be formed by epitaxially growing a semiconductor layer on select areas of the semiconductor substrate 210.

A first isolation region 270a may be provided in the n-well region 220 of the semiconductor substrate 210, and laterally between the first fin 240 and the second fin 250. The first isolation region 270a may extend to a certain depth within the n-well region 220, but may not reach the bottom of the n-well region 220.

A second isolation region 270b may be provided in and at a boundary between the n-well region 220 and the p-well region 230, and laterally between the second fin 250 and the third fin 260. The second isolation region 270b may extend to a certain depth so as not to reach the bottom of the n-well region 220. The second isolation region 270b may extend to a certain depth so as not to reach the bottom of the p-well region 230. The second isolation region 270b may extend to a certain depth so as not to reach the bottom of the n-well region 220 and the bottom of the p-well region 230.

In some example embodiments, the first and second isolation regions 270a and 270b may extend to depths to be shallower than depths of the n-well region 220 and the p-well region 230. The first and second isolation regions 270a and 270b may be formed of or include an insulating material. The formation of the first and second isolation regions 270a and 270b may include forming a trench in the semiconductor substrate 210, and filling the trench with an insulating material.

FIG. 2 illustrates an example vertical PNP bipolar transistor in which the second isolation region 270b extends to a depth shallower than each of the depth of the n-well region 220 and the depth of the p-well region 230. However, example embodiments of the inventive concepts are not limited thereto. According to some example embodiments, the second isolation region 270b may extend to a certain depth, which is deeper than at least one of the depth of the n-well region 220 or the depth of the p-well region 230.

FIG. 2 illustrates an example vertical PNP bipolar transistor in which both the first isolation region 270a and the second isolation region 270b are provided. However, example embodiments of the present application are not limited thereto. In some example embodiments, only one of the first and second isolation regions 270a and 270b may be provided, or none of the first and second isolation regions 270a and 270b may be provided.

Referring to FIG. 2, the first fin 240 may include a first n doped region 240a and a first p+ doped region 240b on the first n doped region 240a. The first p+ doped region 240b may have a higher doping concentration than the p-type substrate 210 and the p-well region 230, and may serve as an emitter E of the PNP bipolar transistor 200. The second fin 250 may include a second n doped region 250a and an n+ doped region 250b on the second n doped region 250a. The n+ doped region 250b may have a higher doping concentration than the n-well region 220, and may serve as a base B of the PNP bipolar transistor 300200. The third fin 260 may include a p doped region 260a and a second p+ doped region 260b on the p doped region 260a. The second p+ doped region 260b may have a higher doping concentration than the p-well region 230 and the p-type substrate 210, and may serve as a collector C of the PNP bipolar transistor 200. The impurity concentration of the first p+ doped region 240b may have the same or substantially similar impurity concentration as the second p+ doped region 260b. The first p+ doped region 240b and the second P+ doped region 260b may be simultaneously formed.

In some example embodiments, the first fin 240, the second fin 250, and the third fin 260 may be formed by patterning the semiconductor substrate 210. Thus, the first, second, and third fins 240, 250, and 260 may have impurity types and impurity concentrations of those of the well regions 220 and 230, respectively. Further, the first p+ doped region 240b, the n+ doped region 250b, and the second p+ doped region 260b may be formed by doping a top portion of the first fin 240 with, for example, boron B, the n+ doped region 250b may be formed by doping a top portion of the second fin 250 with, for example, phosphorous P, and the second p+ doped region 260b may be formed by doping a top portion of the third fin 260 with, for example, boron B.

According to some other example embodiments, the first n doped region 240a, the second n doped region 250a, and the p doped region 260a may be formed by patterning the semiconductor substrate 210. Thus, the first n doped region 240a, the second n doped region 250a, and the p doped region 260a may have impurity types and impurity concentrations of those of the well regions 220 and 230, respectively. However, example embodiments of the present application may not be limited thereto. In some example embodiments, impurity types and impurity concentrations of the first n doped region 240a, the second n doped region 250a, and the p doped region 260a may be separately adjusted.

According to some other example embodiments, the first n doped region 240a, the second n doped region 250a, and the p doped region 260a may be formed by using an epitaxial growth process. The first p+ doped region 240b may be epitaxially-grown on the first n doped region 240a, the n+ doped region 250b may be epitaxially-grown on the second n doped region 250a, and the second p+ doped region 260b may be epitaxially-grown on the p doped region 260a. Further, the first and second p+ doped regions 240b and 260b may be formed by performing an in-situ epitaxial growth process on the first n doped region 240a and the p doped region 260a, respectively, with boron B. The n+ doped region 250b may be formed by performing an in-situ epitaxial growth process on the second n doped region 250a with phosphorus P or arsenic As. The first p+ doped region 240b and the second p+ doped region 260b may be simultaneously formed.

According to the foregoing example embodiments, a junction between the emitter E and the base B (alternatively, referred to as an E-B junction) of the vertical PNP bipolar transistor 200 is provided in the middle (e.g., at a boundary between the first n doped region 240a and the first p+ doped region 240b) of the first fin 240. In other words, a junction between the emitter E and the base B of the vertical PNP bipolar transistor 200 is not provided in the semiconductor substrate 210 (e.g., the n-well region 220).

Figure 3:
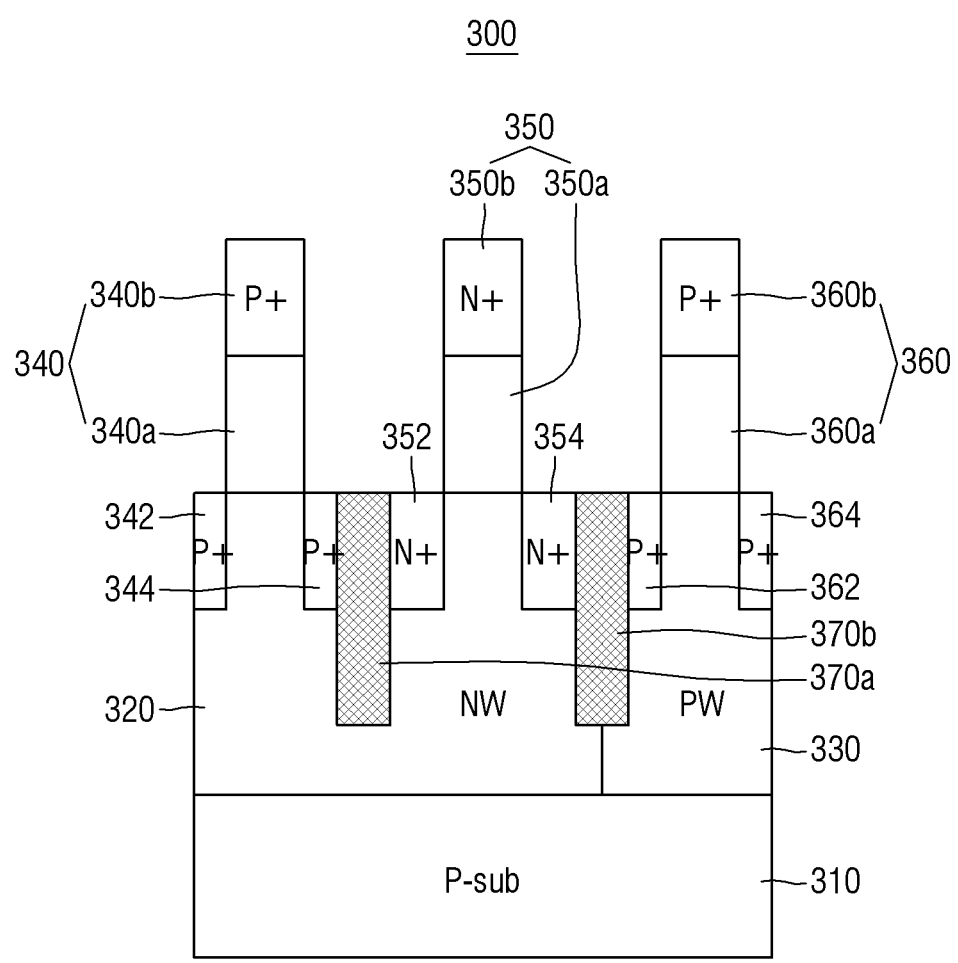
FIG. 3 is a cross-sectional view of a vertical PNP bipolar transistor, taken along line II-II' of FIG. 1, according to an example embodiment of the inventive concepts.

FIG. 3 is a cross-sectional view of a vertical PNP bipolar transistor 300, taken along line II-II' of FIG. 1, according to an example embodiment of the inventive concepts.

The vertical PNP bipolar transistor 300 illustrated in FIG. 3 has the same structure as the vertical PNP bipolar transistor 200 illustrated in FIG. 2 except for additional sub-emitter regions, sub-base regions, and sub-collector regions provided in the semiconductor substrate 310. For concise description, previously described elements may be identified by similar or identical reference numbers without repeating overlapping descriptions thereof.

Referring to FIG. 3, a first fin 340 may include a first n doped region 340a and a first p+ doped region 340b on the first n doped region 340a. The first p+ doped region 340b may have a higher doping concentration than the p-type substrate 310 and the p-well region 330. In this example embodiment, a first sub-emitter region 342 and a second sub-emitter region 344 may be additionally formed in the n-well region 320 in a self-aligned manner with respect to the first fin 340. The first sub-emitter region 342 and the second sub-emitter region 344 may be doped with p type impurities and have a doping concentration comparable to that of the first p+ doped region 340b. The first p+ doped region 340b and the first and second sub-emitter regions 342 and 344 may collectively serve as an emitter E of the vertical PNP bipolar transistor 300. The first and second sub-emitter regions 342 and 344 may be formed by performing an ion-implantation process using the first fin 340 as a mask. However, example embodiments of the present application is not limited thereto. In some example embodiments, the first and second sub-emitter regions 342 and 344 may be formed by recessing the semiconductor substrate 310 and epitaxially growing a semiconductor structure therein with appropriate impurities (e.g., dopants).

Referring to FIG. 3, the second fin 350 may include a second n doped region 350a and an n+ doped region 350b on the second n doped region 350a. The n+ doped region 350b may have a higher doping concentration than the n-well region 320. In this example embodiment, a first sub-base region 352 and a second sub-base region 354 may be additionally formed in the n-well region 320 in a self-aligned manner with respect to the second fin 350. The first sub-base region 352 and the second sub-base region 354 may be doped with n type impurities, and have a doping concentration comparable to that of the n+ doped region 350b. The n+ doped region 350b and the first and second sub-base regions 352 and 354 may collectively serve as a base B of the vertical PNP bipolar transistor 300. The first and second sub-base regions 352 and 354 may be formed by using a thermal diffusion process or by performing an ion-implantation process using the second fin 350 as a mask. However, example embodiments of the present application is not limited thereto. In some example embodiments, the first and second sub-base regions 352 and 354 may be formed by recessing the semiconductor substrate 310 and epitaxially growing a semiconductor structure therein with appropriate impurities (e.g., dopants).

Referring to FIG. 3, the third fin 360 may include a p doped region 360a and a second p+ doped region 360b on the p doped region 360a. The second p+ doped region 360b may have a higher doping concentration than the p-type substrate 310 and the p-well region 330. In this example embodiment, a first sub-collector region 362 and a second sub-collector region 364 may be additionally formed in the p-well region 330 in a self-aligned manner with respect to the third fin 360. The first sub-collector region 362 and the second sub-collector region 364 may be doped with p type impurities, and have a doping concentration comparable to that of the second p+ doped region 360b. The second p+ doped region 360b and the first and second sub-collector regions 362 and 364 may collectively serve as a collector C of the vertical PNP bipolar transistor 300. The impurity concentrations of the second p+ doped region 360b and the first and second sub-collector regions 362 and 364 may be the same as or substantially similar to those of the first p+ doped region 340b and the first and second sub-emitter regions 342 and 344.

The first and second sub-emitter regions 342 and 344 may be formed by performing an ion-implantation process using the first fin 340 as a mask. The first and second sub-base regions 352 and 354 may be formed by performing an ion-implantation process using the second fin 350 as a mask. The first and second sub-collector regions 362 and 364 may be formed by using an ion-implantation process using the third fin 360 as a mask. However, example embodiments of the present application is not limited thereto. In some example embodiments, the first and second sub-emitter regions 342 and 344, the first and second sub-base regions 352 and 354, and the first and second sub-collector regions 362 and 364 may be formed by recessing the semiconductor substrate 310 and epitaxially growing a semiconductor structure therein with appropriate impurities (e.g., dopants).

In some example embodiments, the first p+ doped region 340b may be separately provided from the first and second sub-emitter regions 342 and 344, the n+ doped region 350b may be separately provided from the first and second sub-base regions 352 and 354, and the second p+ doped region 360b may be separately provided from the first and second sub-collector regions 362 and 364. For example, the first and second sub-emitter regions 342 and 344 may be formed by using an ion implantation process and the first p+ doped region 340b may be formed by using an epitaxial growth process, the first and second sub-base regions 352 and 354 may be formed by using an ion implantation process and the n+ doped region 350b may be formed by using an epitaxial growth process, and the first and second sub-collector regions 362 and 364 may be formed by using an ion implantation process and the second p+ doped region 360b may be formed by using an epitaxial growth process.

Like FIG. 2, FIG. 3 illustrates an example vertical PNP bipolar transistor in which first and second isolation regions 370a and 370b are provided. However, example embodiments of the present application are not limited thereto. In some example embodiments, only one of the first and second isolation regions 370a and 370b may be provided, or none of the first and second isolation regions 370a and 370b may be provided. For example, the second sub-emitter region 344 and the first sub-base region 352 may be spaced apart from each other by a distance. Similarly, the second-base region 354 and the first sub-collector region 362 may be spaced apart from each other by a distance.

Furthermore, FIG. 3 illustrates an example vertical PNP bipolar transistor in which at least one sub-emitter region for the emitter E includes the first and second sub-emitter regions 342 and 344. However, example embodiments of the present application are not limited thereto. In some example embodiments, only one of the first and second sub-emitter regions 342 and 344 may be provided. Likewise, only one of the first and second sub-base regions 352 and 354 may be provided, and/or only one of the first and second sub-collector regions 362 and 364 may be provided.

According to this example embodiment, junctions between the emitter E and the base B (alternatively, referred to as E-B junctions) of the vertical PNP bipolar transistor 300 is provided in the middle (e.g., at a boundary between the first n doped region 340a and the first p+ doped region 340b) of the first fin 340 as well as in the n-well region 320. Thus, the E-B junctions of the vertical PNP bipolar transistor 300 as illustrated in FIG. 3 may provide more stable electrical characteristics compared to the E-B junction of the vertical PNP bipolar transistor 200 as illustrated in FIG. 2.

Figure 4:
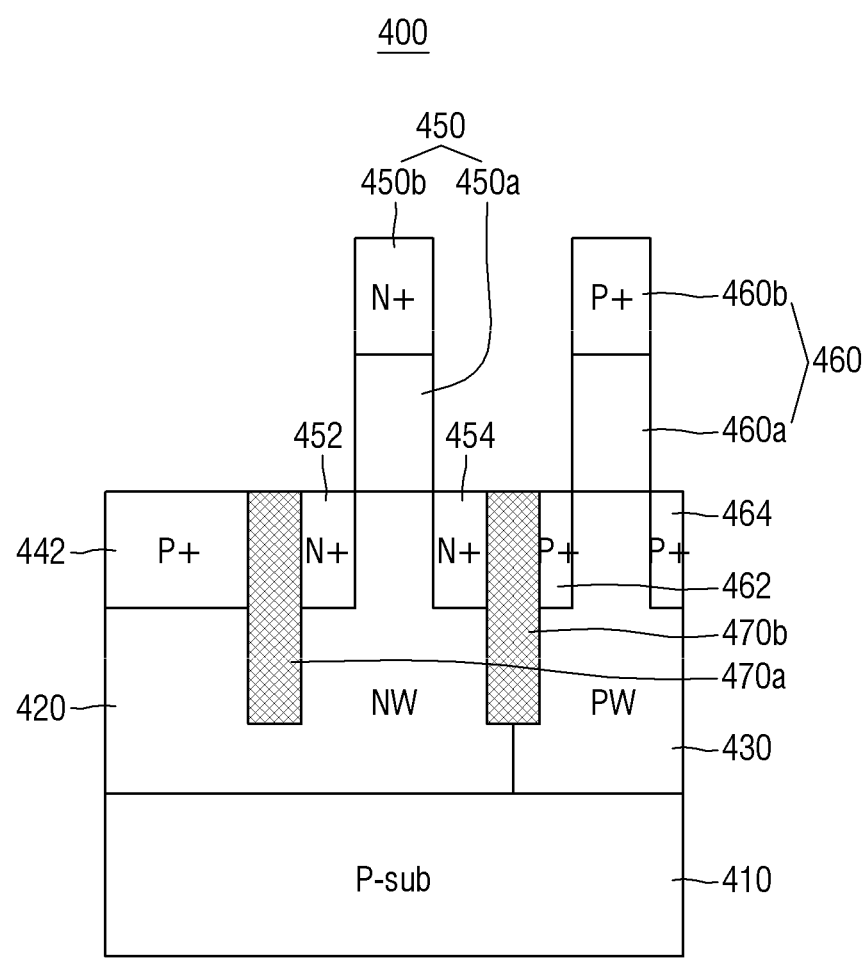
FIG. 4 is a cross-sectional view of a vertical PNP bipolar transistor, taken along line II-II' of FIG. 1, according to an example embodiment of the inventive concepts.

FIG. 4 is a cross-sectional view of a vertical PNP bipolar transistor 400, taken along line II-II' of FIG. 1, according to an example embodiment of the inventive concepts. The vertical PNP bipolar transistor 400 illustrated in FIG. 4 has the same structure as the vertical PNP bipolar transistor 300 illustrated in FIG. 3 except that no fin is provided in a region at which an emitter E is provided, and a first p+ doped region 442 may be provided in an n-well region 420, and serve as an emitter E. For concise description, previously described elements may be identified by similar or identical reference numbers without repeating overlapping descriptions thereof.

The first p+ doped region 442 may be formed by using, for example, an ion implantation process. For example, the first p+ doped region 442, a second P+ doped region 460b, and first and second sub-collector regions 462 and 464 may be simultaneously formed in a same process step. In some example embodiments, the first p+ doped region 442 may be formed by recessing the semiconductor substrate 410 and epitaxially growing a semiconductor structure therein with p type impurities (e.g., boron B).

In some example embodiments, the first p+ doped region 442 and the first and second sub-collector regions 462 and 464 may be simultaneously formed in a same process, and the second P+ doped region 460b may be separately formed in a different process. For example, the second P+ doped region 460b may be formed by using a separate epitaxial growth process on a p doped region 460a.

Like FIGS. 2 and 3, FIG. 4 illustrates an example vertical PNP bipolar transistor 400 in which first and second isolation regions 470a and 470b are provided. However, example embodiments of the present application are not limited thereto. In some example embodiments, only one of the first and second isolation regions 470a and 470b may be provided, or none of the first and second isolation regions 470a and 470b may be provided. For example, the first p+ doped region 442 and the first sub-base region 452 may be laterally separated by the first isolation region 470a. Similarly, the second-base region 454 and the first sub-collector region 462 may be laterally separated by the second isolation region 470b.

FIG. 4 illustrates an example vertical PNP bipolar transistor in which at least one sub-base region for the base B includes the first and second sub-base regions 452 and 454. However, example embodiments of the present application are not limited thereto. In some example embodiments, only one of the sub-base regions 452 and 454 may be provided. Likewise, only one of the sub-collector regions 462 and 464 may be provided. In some example embodiments, more than two sub-base regions may be provided.

According to this example embodiment, an E-B junction between the emitter E and the base B of the vertical PNP bipolar transistor 400 is provided in the n-well region 420. Thus, the E-B junction of the vertical PNP bipolar transistor 400 as illustrated in FIG. 4 may provide relatively stable electrical characteristics compared to the E-B junction of the vertical PNP bipolar transistor 200 as illustrated in FIG. 2 and the E-B junction of the vertical PNP bipolar transistor 300 as illustrated in FIG. 3.

Figure 5:
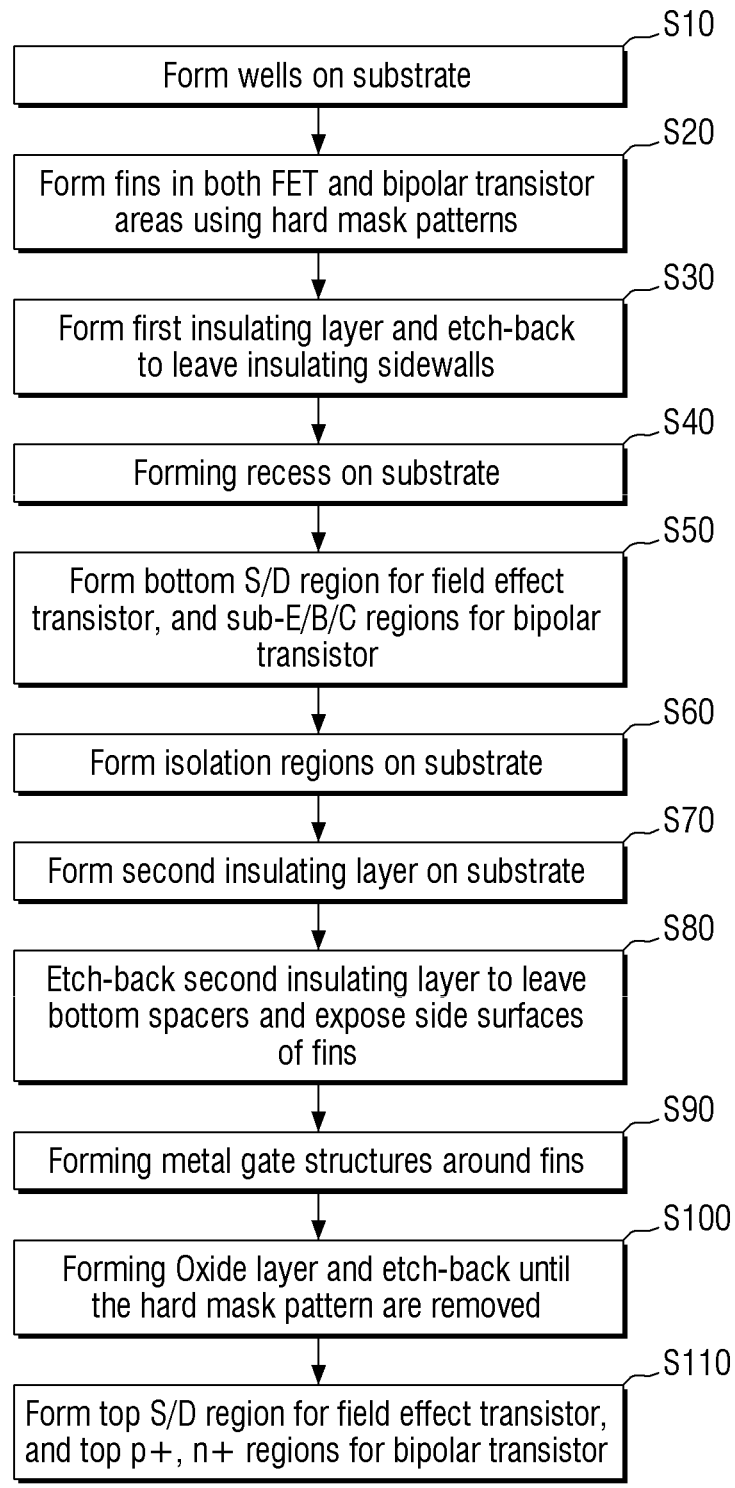
FIG. 5 is a flowchart illustrating operations for forming the vertical PNP bipolar transistor illustrated in FIG. 3, while forming a vertical field effect transistor (VTFET), according to an example embodiment of the inventive concepts.

FIG. 5 is a flowchart illustrating operations for forming the vertical PNP bipolar transistor illustrated in FIG. 3, while forming a vertical field effect transistor (VTFET), according to an example embodiment of the inventive concepts.

Referring to FIG. 5, in operation S10, a plurality of n-well regions and a plurality of p-well regions may be formed on a semiconductor substrate. In some example embodiments, (1) first select areas may be covered by first block layer patterns, and areas not covered by the first block layer patterns may be subject to ion implantation of p-type to form the plurality of p-well regions, and subsequently (2) the second select areas may be covered by second block layer patterns, and areas not covered by the second block layer patterns may be subject to ion implantation of n-type to form the plurality of n-well regions.

In operation S20, a plurality of hard mask patterns may be formed on the semiconductor substrates on which the plurality of n-well regions and the plurality of p-well regions have been formed. Then, the semiconductor substrate may be etched using the plurality of hard mask patterns to form a plurality of fins, which protrude from the semiconductor substrate. In some example embodiments, the plurality of fins may be selectively grown on the semiconductor substrate by using an epitaxial growth, instead of etching the semiconductor substrate. In this operation, the plurality of fins for a vertical bipolar transistor and the plurality of fins for a VTFET may be simultaneously formed during this operation.

In operation S30, a first insulating layer may be conformally formed on the semiconductor substrate on which a plurality of fins having corresponding ones of the plurality of hard mask patterns thereon have been formed, and may be etched-back to leave a plurality of insulating sidewalls. The first insulating layer may include silicon nitride.

In operation S40, the semiconductor substrate may be etched to form a plurality of recesses using the plurality of hard mask patterns and the plurality of insulating sidewalls as a mask. However, example embodiments of the present application are not limited thereto. According to some example embodiments of the present application, this operation may be skipped, and thus a plurality of recesses may not be formed.

In operation S50, a plurality of bottom source/drain (S/D) regions for the VTFET may be formed by epitaxially growing a plurality of n+ doped bottom S/D regions and a plurality of p+ doped bottom S/D regions in corresponding ones of the plurality of recesses, respectively. However, example embodiments of the present application are not limited thereto. According to some example embodiments of the present application, for example, in the case where operation S40 is skipped, the plurality of n+ doped bottom S/D regions and the plurality of p+ doped bottom S/D regions may be formed by using an ion implantation process. The plurality of sub emitter regions, the plurality of sub base regions, and the plurality of sub collector regions for the vertical bipolar transistor may be simultaneously formed during this operation.

In operation S60, a plurality of isolation regions may be provided in the semiconductor substrate to define a plurality of active regions therebetween. In some example embodiments, the isolation region may be formed using a shallow trench isolation (STI) technique.

In operation S60, a second insulating layer may be formed on the semiconductor substrate. Then, the second insulating layer may be etched back to leave a remaining structure to serve as a plurality of bottom spacers, and to expose side surfaces of the plurality of fins in operation S80. The second insulating layer may include silicon nitride.

In operation S90, a plurality of metal gate structures may be formed around the side surfaces of the plurality of fins, respectively. In some example embodiments, each of the plurality of metal gate structures may include a gate insulating layer, a work function metal layer, and a capping metal layer.

In operation S100, an oxide layer may be formed so that the top surface of the oxide layer is positioned above the top surface of the plurality of hard mask patterns, and then the oxide layer may be etched back. By selecting the plurality of hard mask patterns and the oxide layer not to have an etch selectivity with each other, the plurality of hard mask patterns may be removed while the oxide layer is etched back. Accordingly, the top surface of each of the plurality of fins may be exposed.

In operation S110, a plurality of top source/drain (S/D) regions for the VTFET may be formed by epitaxially growing a plurality of n+ doped top S/D regions and a plurality of p+ doped top S/D regions on corresponding ones of the plurality of fins, respectively. However, example embodiments of the present application are not limited thereto. According to some example embodiments of the present application, for example, the plurality of n+ doped top S/D regions and the plurality of p+ doped top S/D regions may be formed by using an ion implantation process. The plurality of p+ doped regions and n+ doped regions for the vertical bipolar transistor may be simultaneously formed during this operation.

As described above with reference to FIG. 5, according some example embodiments of the present application, a vertical bipolar transistor may be implemented using the processes (or alternatively, operations) for forming a VTFET. Thus, the processes for forming a VTFET may be used to form the vertical bipolar transistor with no additional processes.

Herein below, the operations S10 through S110 of FIG. 5 will be explained in detail with reference to FIGS. 6, 7, 8, 9, 10, 11A, 11B, 12A, 12B, 13A, 13B, 14A, 14B, 15A, 15B, 16A, 16B, 17A, 17B, 18A, and 18B.

FIGS. 6, 7, 8, 9, 10, 11A, 12A, 13A, 14A, 15A, 16A, 17A, and 18A are cross-sectional views illustrating a method of forming a VTFET, according to an example embodiment of the inventive concepts. FIGS. 11B, 12B, 13B, 14B, 15B, 16B, 17B, and 18B are cross-sectional views illustrating a method of forming the vertical PNP bipolar transistor illustrated in FIG. 3, while forming the VTFET as illustrated in FIGS. 11A, 12A, 13A, 14A, 15A, 16A, 17A, and 18A, according to an example embodiment of the inventive concepts.

Figure 6:
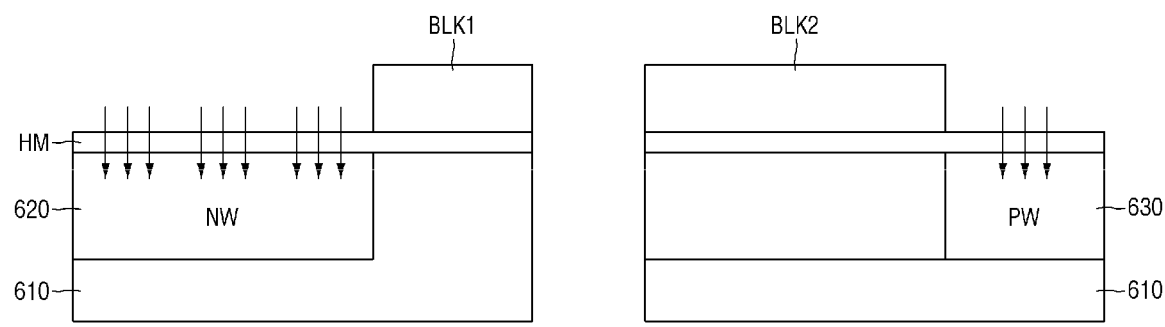
FIGS. 6, 7, 8, 9, 10, 11A, 12A, 13A, 14A, 15A, 16A, 17A, and 18A are cross-sectional views illustrating a method of forming a VTFET, according to an example embodiment of the inventive concepts.

Referring to FIG. 6, an n-well region 620 and a p-well region 630 may be formed on a semiconductor substrate 610. The n-well region 620 may be formed by covering non-n-well region with a first block layer pattern BLK1, and implanting n type impurities (e.g., boron B) into the n-well region 620 using the first block layer pattern BLK1 as an implant mask. The p-well region 630 may be formed by covering non-p-well region with a second block layer pattern BLK2 and implanting p type impurities (e.g., phosphorous Ph) using the second block layer pattern BLK2 as an implant mask. A hard mask layer HM may be formed on the semiconductor substrate 610 to mitigate or prevent defects on the semiconductor substrate 610 while introducing n-type and p-type impurities using an ion implant process. The hard mask layer HM may include a dense silicon oxide material. FIG. 6 may correspond to operation S10 of FIG. 5

Figure 7:
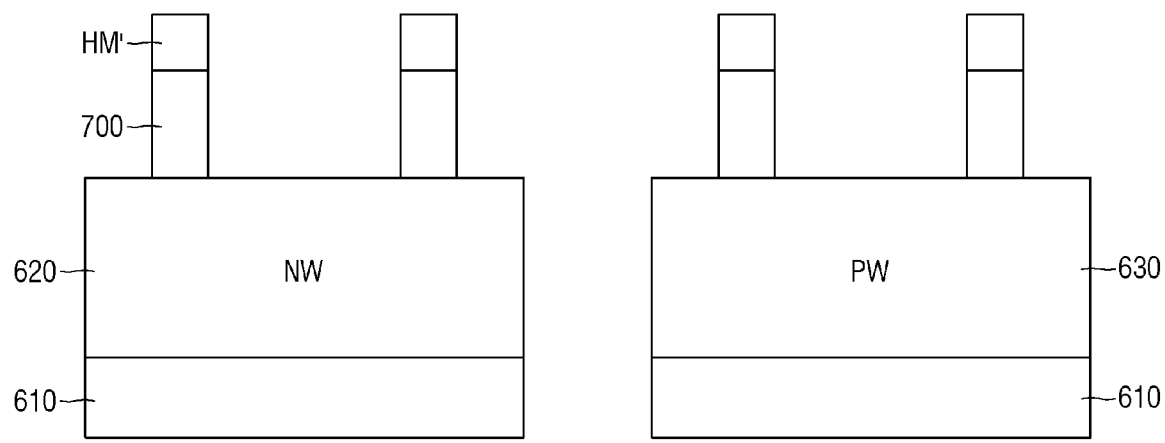

Referring to FIG. 7, the hard mask layer HM may be etched to form a plurality of hard mask patterns HM'. Further, using the plurality of hard mask patterns HM', the semiconductor substrate 610 may be etched to form a plurality of fins 700, which protrude from the semiconductor substrate 610. In this operation, a first sub-set of the plurality of fins for a vertical bipolar transistor and a second sub-set of the plurality of fins for a VTFET may be simultaneously formed during this operation. FIG. 7 may correspond to operation S20 of FIG. 5

In some example embodiments, the plurality of fins 700 may be selectively grown on the semiconductor substrate 610 by using an epitaxial growth, instead of etching the semiconductor substrate 610.

Figure 8:
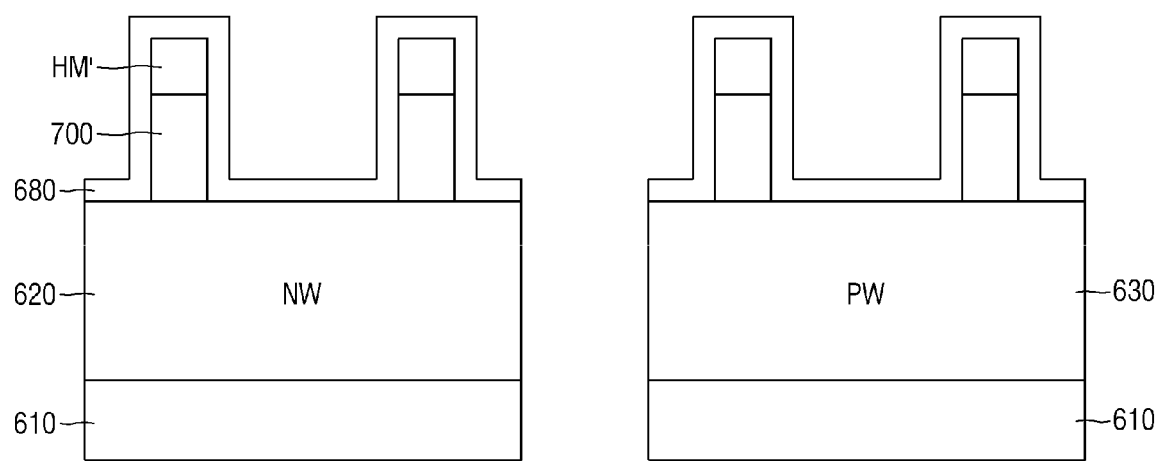

Referring to FIG. 8, a first insulating layer 680 may be conformally formed on the semiconductor substrate 610 on which the plurality of fins 700 having corresponding ones of the plurality of hard mask patterns HM' thereon have been formed. The first insulating layer 680 may include silicon nitride.

Figure 9:
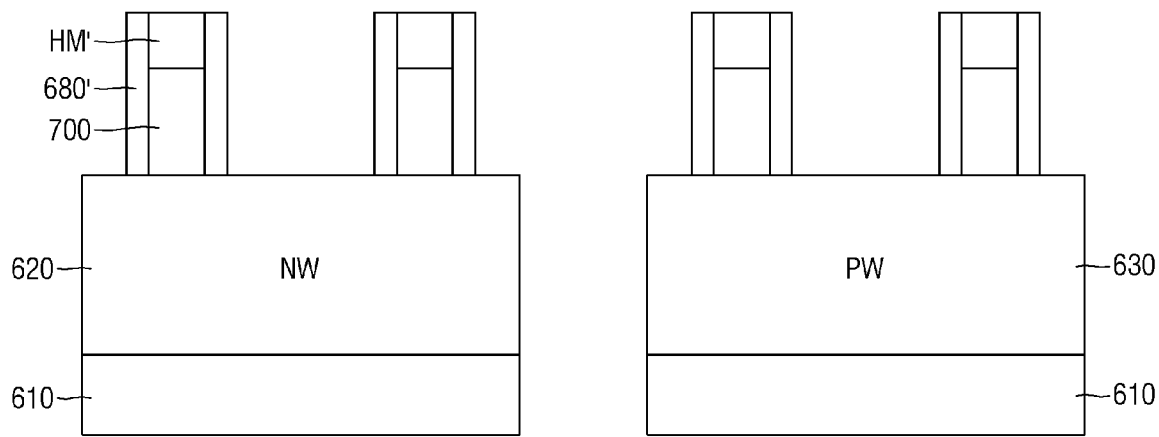

Then, the first insulating layer 680 may be etched-back to leave a plurality of insulating sidewalls 680', as illustrated in FIG. 9. The first insulating layer 680 may be etched-back by using a reactive ion etching. FIGS. 8 and 9 may correspond to operation S30 of FIG. 5.

Figure 10:
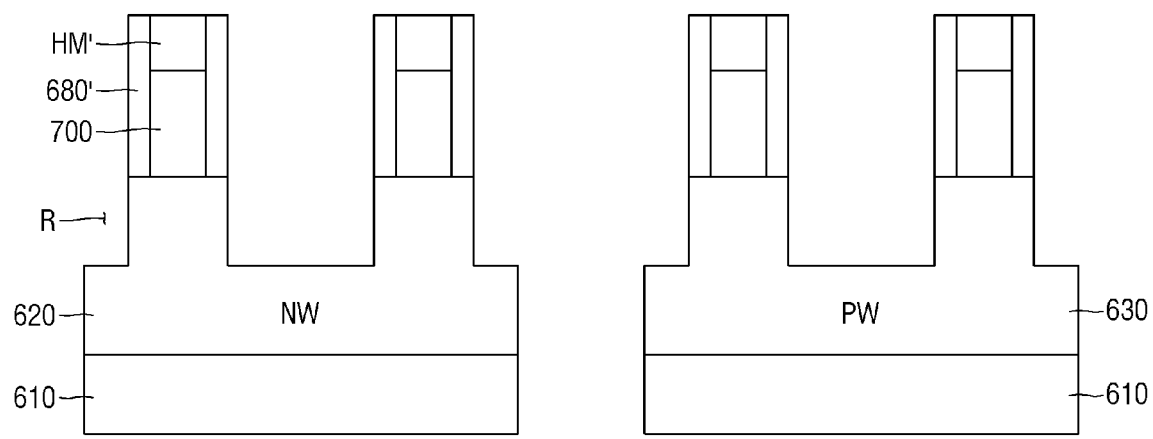

Referring to FIG. 10, the semiconductor substrate 610 may be etched to form a plurality of recesses R using the plurality of hard mask patterns HM' and the plurality of insulating sidewalls 680' as a mask. However, example embodiments of the present application are not limited thereto. According to some example embodiments of the present application, this operation may be skipped, and thus a plurality of recesses may not be formed. FIG. 10 corresponds to operation S40 of FIG. 5. The plurality of recesses R may be formed by removing the semiconductor substrate 610 to a certain depth by using a reactive ion etching, which has a high selectivity with respect to the semiconductor substrate 610 compared with the plurality of hard mask patterns HM' and the plurality of insulating sidewalls 680'. FIG. 10 may correspond to operation S40 of FIG. 5.

Figure 11A:
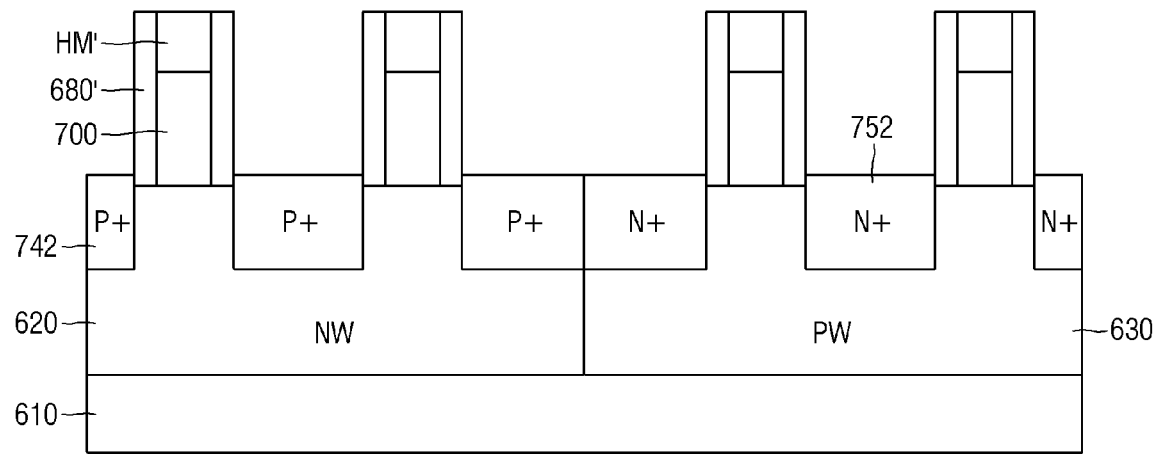
Figure 11B:
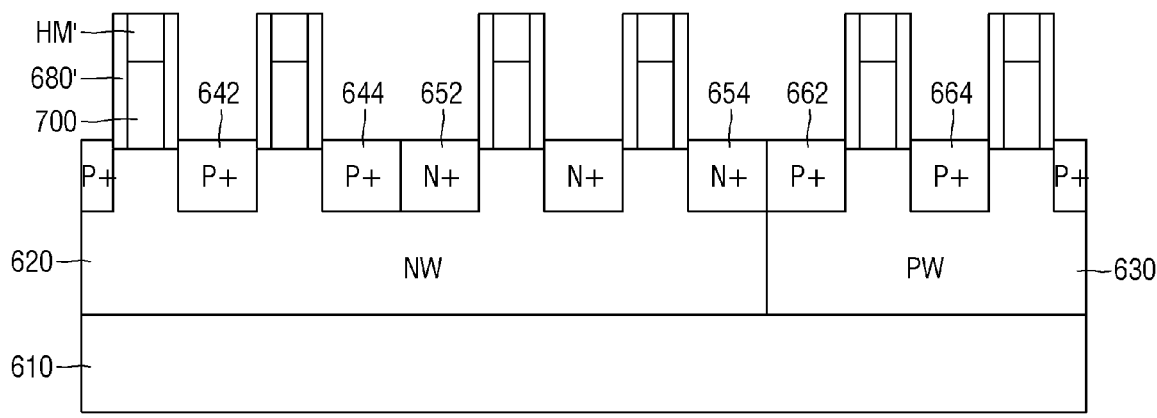
FIGS. 11B, 12B, 13B, 14B, 15B, 16B, 17B, and 18B are cross-sectional views illustrating a method of forming the vertical PNP bipolar transistor illustrated in FIG. 3, while forming the VTFET as illustrated in FIGS. 11A, 12A, 13A, 14A, 15A, 16A, 17A, and 18A, according to an example embodiment of the inventive concepts.

Referring to FIG. 11A, a plurality of bottom source/drain (S/D) regions 742 and 752 for the VTFET may be formed by epitaxially growing a plurality of n+ doped bottom S/D regions 752 and a plurality of p+ doped bottom S/D regions 742 in corresponding ones of the plurality of recesses R, respectively. The plurality of sub emitter regions 642 and 644, the plurality of sub base regions 652 and 654, and the plurality of sub collector regions 662 and 664 for the vertical bipolar transistor may be simultaneously formed during this operation, as illustrated in FIG. 11B. FIGS. 11A and 11B may correspond to operation S50 of FIG. 5.

According to some example embodiments of the present application, the plurality of recesses R may not be formed. In such cases, the plurality of n+ doped bottom S/D regions 752 and the plurality of p+ doped bottom S/D regions 742 may be formed by using an ion implantation process. Each of the plurality of n+ doped bottom S/D regions 752 may function as one of a source or a drain of a NMOS VTFET, and the plurality of p+ doped bottom S/D regions 742 may function as one of a source or a drain of a PMOS VTFET.

The plurality of sub emitter regions 642 and 644, the plurality of sub base regions 652 and 654, and the plurality of sub collector regions 662 and 664 for the vertical bipolar transistor may also be simultaneously formed using the ion implant process. In an example of a PNP vertical bipolar transistor, the plurality of sub emitter regions 642 and 644 may be p+ doped regions, the plurality of sub base regions 652 and 654 may be n+ doped regions, and the plurality of sub collector regions 662 and 664 may be p+ doped regions.

Figure 12A:
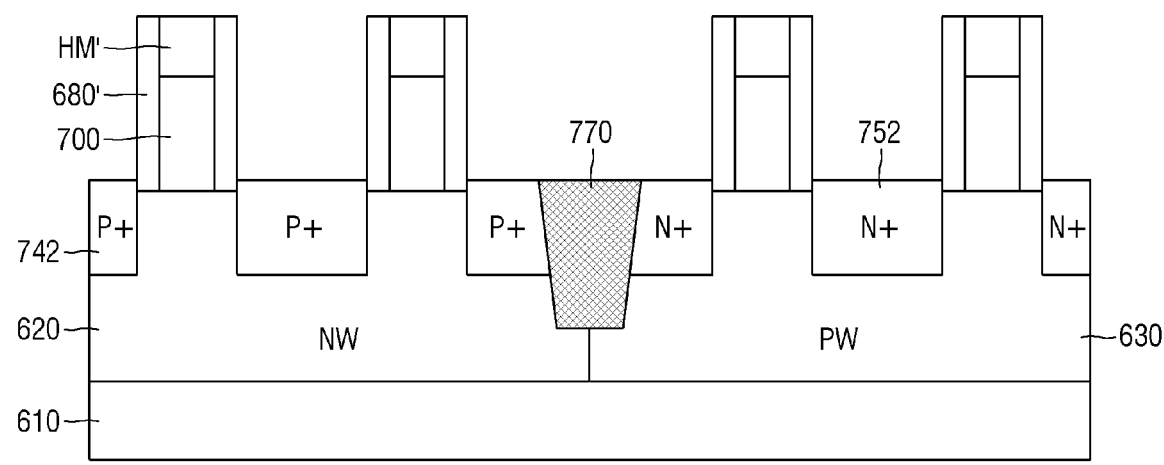
Figure 12B:
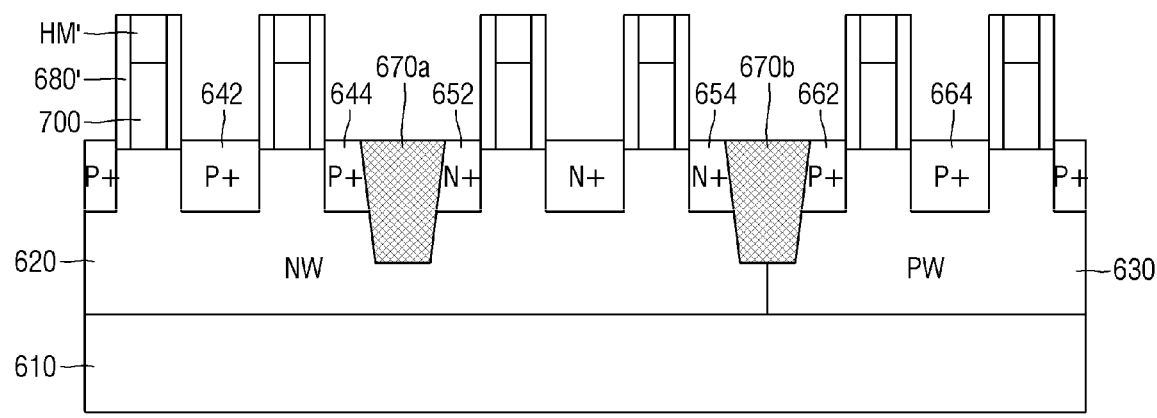

Referring to FIGS. 12A and 12B, a plurality of isolation regions 770, 670a, and 670b may be provided in the semiconductor substrate to define a plurality of active regions therebetween. In some example embodiments, the plurality of isolation regions 770, 670a, and 670b may be formed using a shallow trench isolation (STI) technique. FIGS. 12A and 12B may correspond to operation S60 of FIG. 5.

Figure 13A:
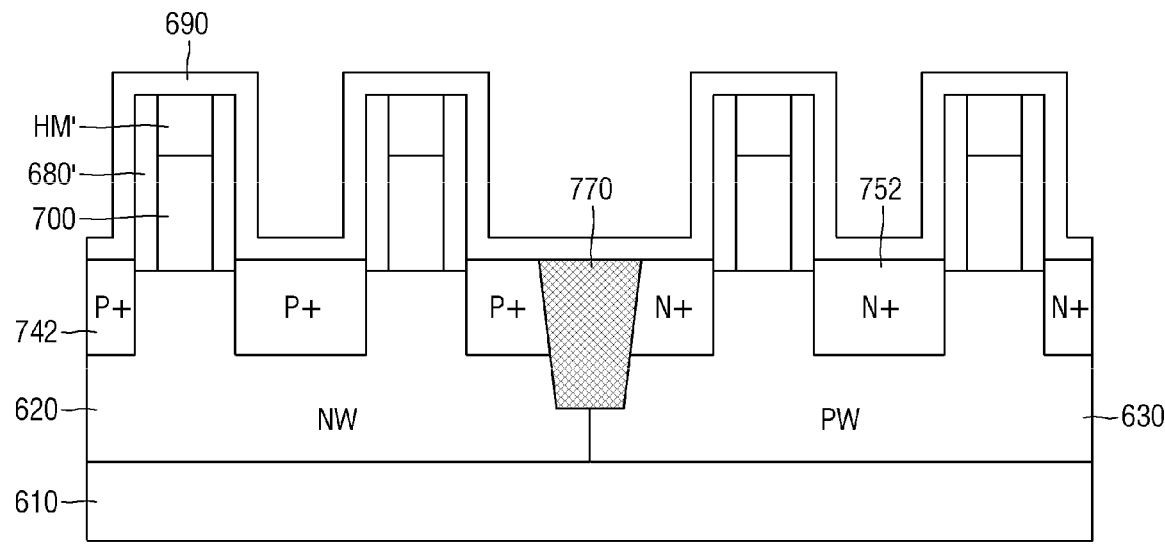
Figure 13B:
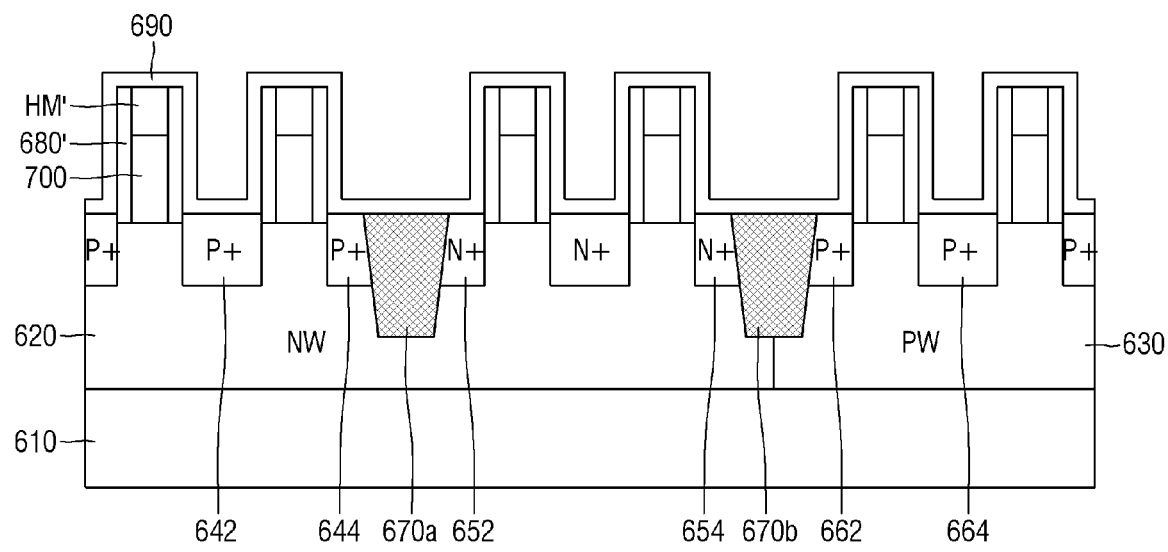

Referring to FIGS. 13A and 13B, a second insulating layer 690 may be formed on the semiconductor substrate 610. The second insulating layer may include silicon nitride. The second insulating layer 690 may have a high etch selectivity to the plurality of hard mask pattern HM'. The second insulating layer 690 may have the same or substantially similar etch characteristics with regard to the plurality of insulating sidewalls 680'. The second insulating layer 690 may include silicon nitride. The plurality of insulating sidewalls 680' and the second insulating layer 690 may include silicon nitride. FIGS. 13A and 13B may correspond to operation S70 of FIG. 5.

Figure 14A:
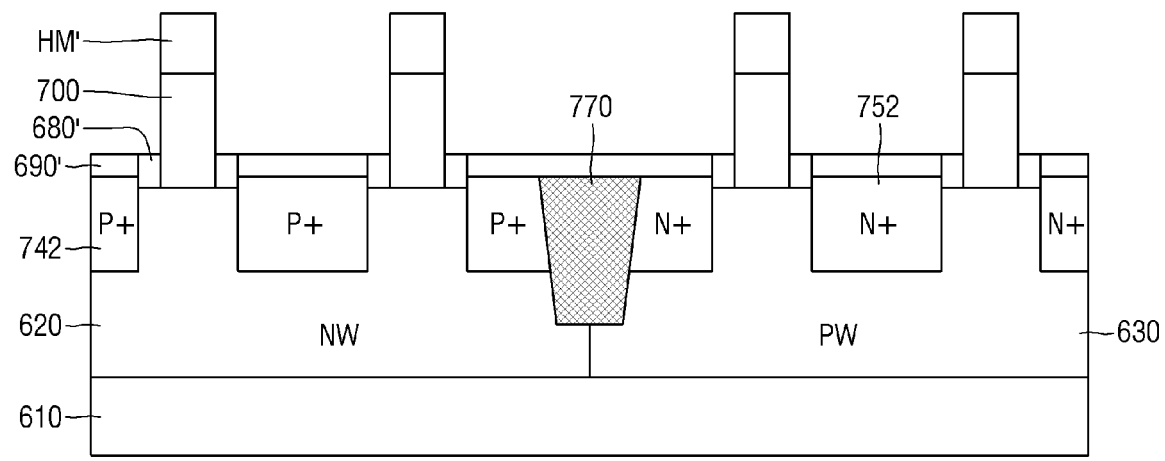
Figure 14B:
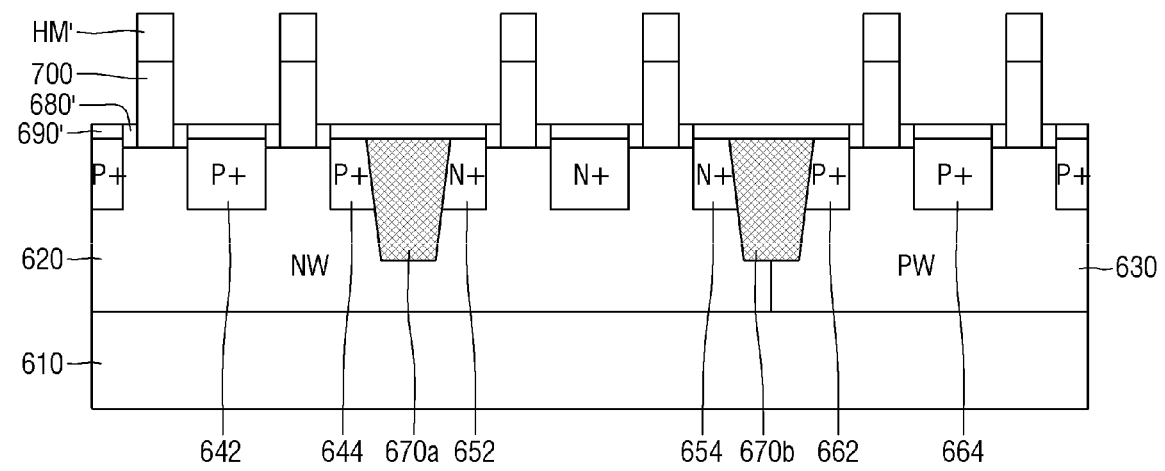

Then, as illustrated in FIGS. 14A and 14B, the second insulating layer 690 may be etched back to leave a remaining structure 690' to serve as a plurality of bottom spacers, and to expose side surfaces of the plurality of fins 700. The second insulating layer 690 may be etched be using a reactive ion etch process. FIGS. 14A and 14B may correspond to operation S80 of FIG. 5.

Figure 15A:
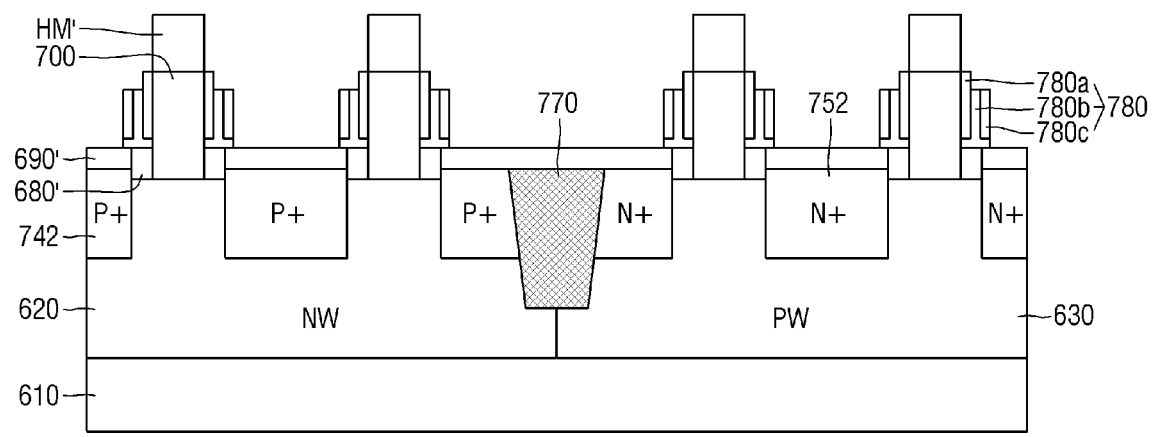
Figure 15B:
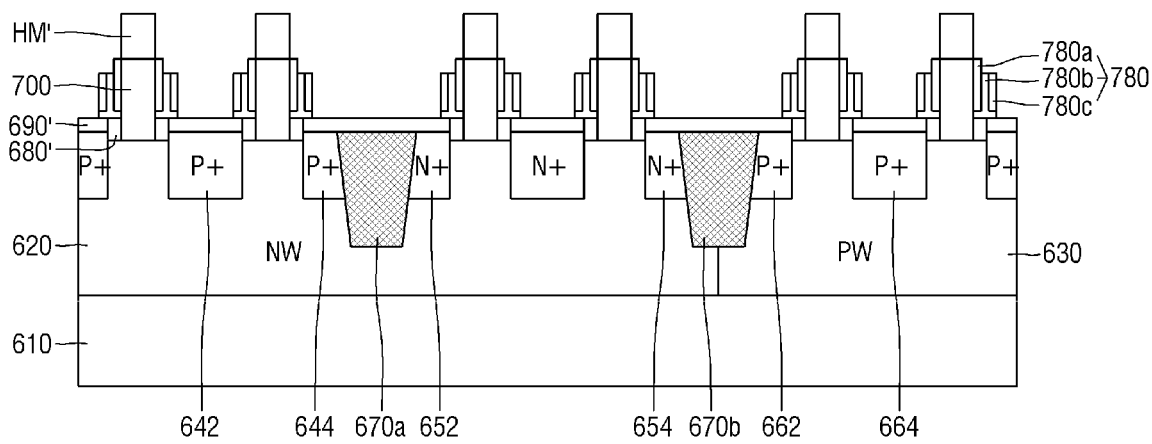

Referring to FIGS. 15A and 15B, a plurality of metal gate structures 780 may be formed around the side surfaces of the plurality of fins 700, respectively. Each of the plurality of metal gate structures 780 may include a gate insulating layer 780a, a work function metal layer 780b, and a capping metal layer 780c. FIGS. 15A and 15B may correspond to operation S90 of FIG. 5.

For brevity of description, process for forming the plurality of metal gate structures 780 are not described in detail.

The gate insulating layer 780a may include a high-k material.

The work function metal layer 780b may be formed on the gate insulating layer 780a. A work function of the work function metal layer 780b for the VTFET may be determined based on material characteristics as well as a thickness of the work function metal layer 780b. In some example embodiments, the work function metal layer may be implemented to have different thicknesses depending on locations. The work function metal layer may include TiN.

The capping metal layer 780c may be subsequently formed on the work function metal layer 780b. The capping metal layer 780c may include at least one of TiC, TiAlC, or TiAl.

Figure 16A:
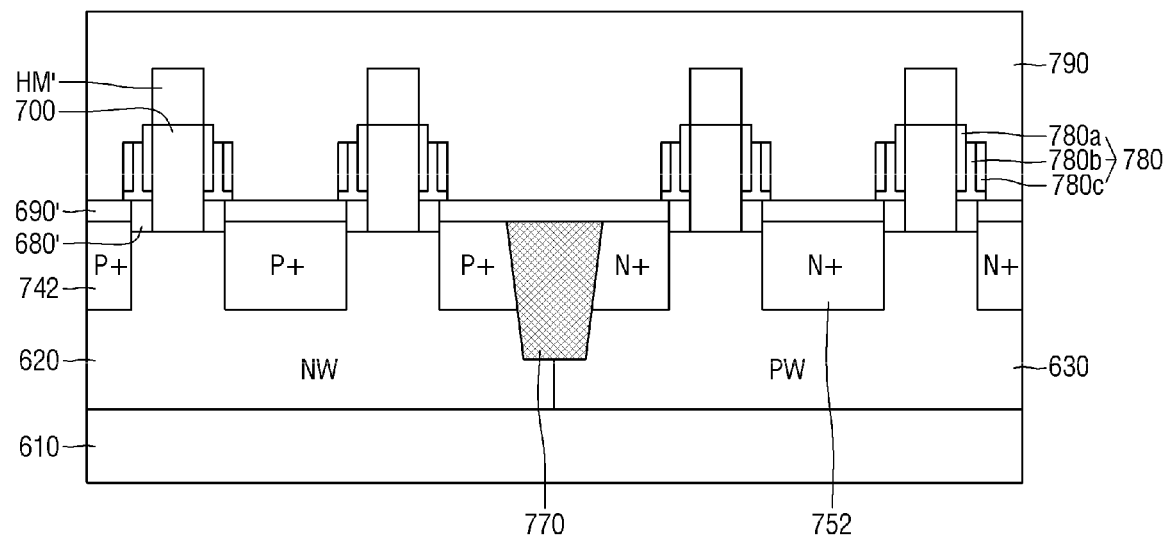
Figure 16B:
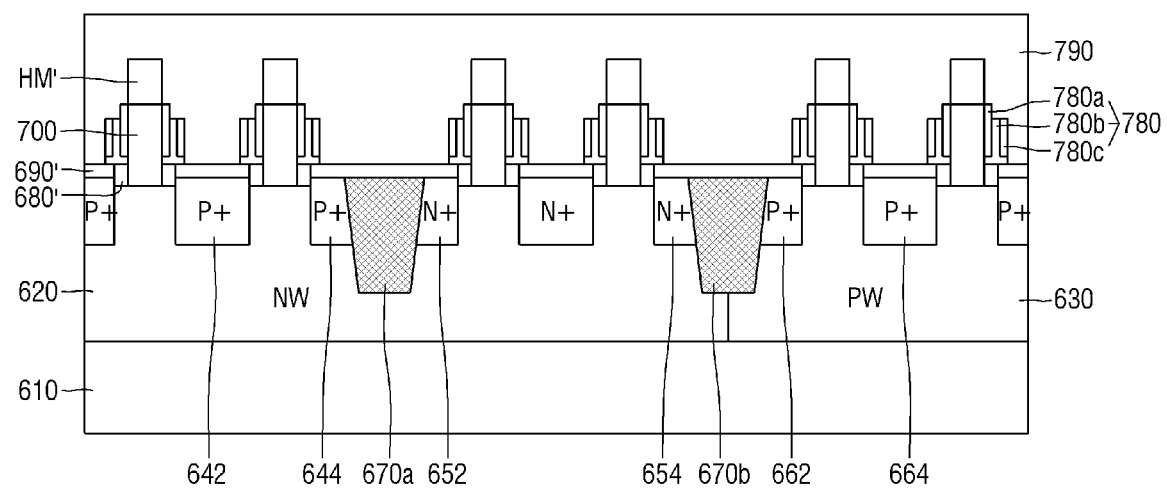

Referring to FIGS. 16A and 16B, an oxide layer 790 may be formed so that the the top surface of the plurality of hard mask patterns HM' are covered by the oxide layer 790. For the sake of simplicity, the oxide layer 790 is illustrated as having a flat top surface. However, example embodiments of the present application are not limited thereto. According to some example embodiments of the present application, a top surface of the oxide layer 790 may not be flat, and follow the underlying topology of semiconductor structures on the semiconductor substrate 610.

Figure 17A:
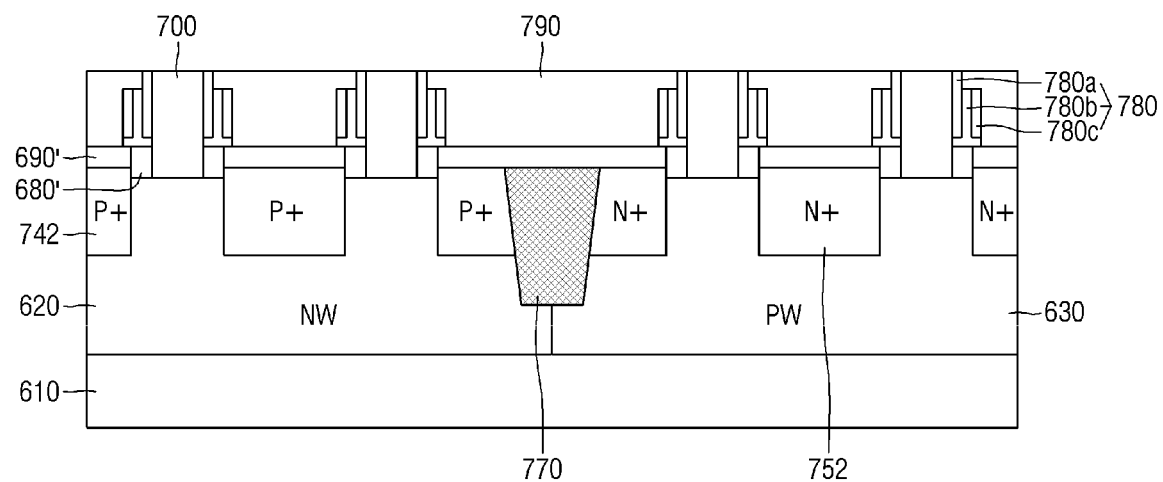
Figure 17B:
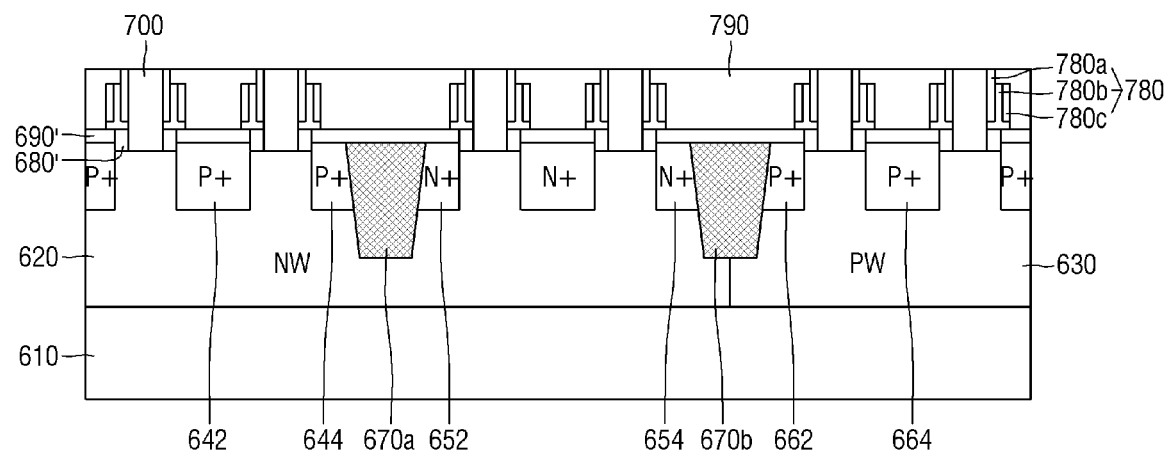

Then, the oxide layer 790 may be etched back until the plurality of hard mask patterns HM' are completely removed, as illustrated in FIGS. 17A and 17B. By selecting the plurality of hard mask patterns HM' and the oxide layer 790 not to have an etch selectivity with each other, the plurality of hard mask patterns HM' may be removed while the oxide layer 790 is etched back. Accordingly, the top surface of each of the plurality of fins 700 may be exposed. FIGS. 16A, 16B, 17A, and 17B may correspond to operation S100 of FIG. 5.

Figure 18A:
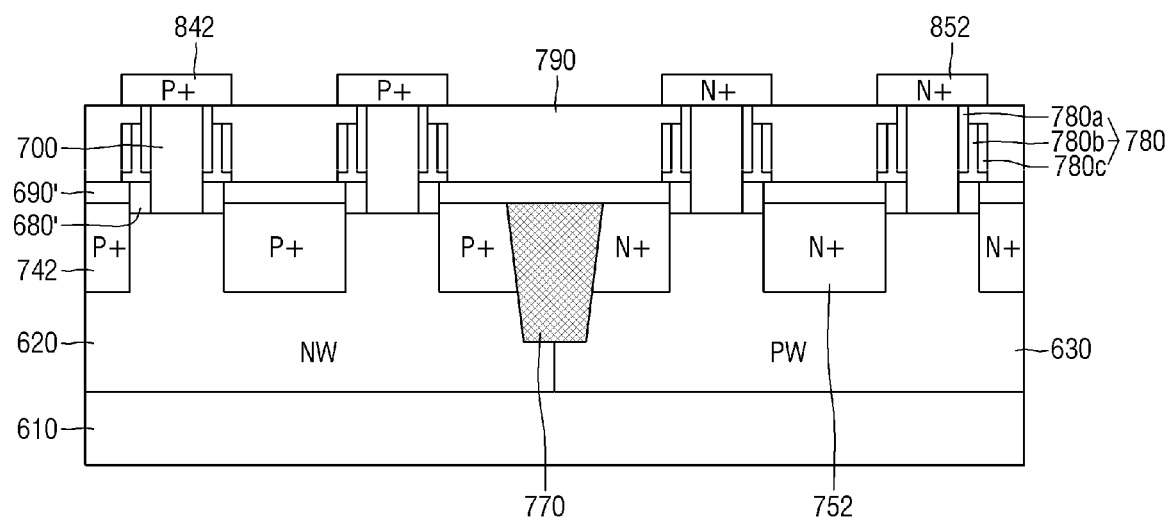

Referring to FIG. 18A, a plurality of top source/drain (S/D) regions 842 and 852 for the VTFET may be formed by epitaxially growing a plurality of n+ doped top S/D regions 852 and a plurality of p+ doped top S/D regions 842 on corresponding ones of the plurality of fins, respectively. Each of the plurality of n+ doped top S/D regions 852 may function as one of a source or a drain of a NMOS VTFET, and the plurality of p+ doped top S/D regions 842 may function as one of a source or a drain of a PMOS VTFET. However, example embodiments of the present application are not limited thereto. According to some example embodiments of the present application, a plurality of top source/drain (S/D) regions 842 and 852 for the VTFET may be formed by using an ion implantation process.

Figure 18B:
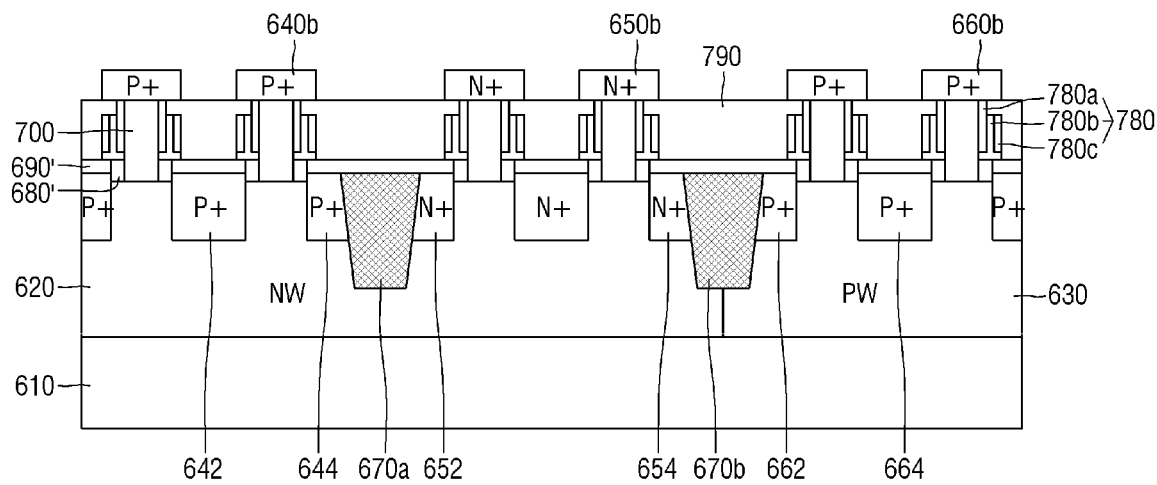

As illustrated in FIG. 18b, a first p+ doped region 640b, an n+ doped region 650b, and a second p+ doped region 660b for, for example, an PNP vertical bipolar transistor may be simultaneously formed during this operation.

FIGS. 18A and 18b may correspond to operation S110 of FIG. 5.

As described above referring to FIGS. 5-10, 11A, 11B, . . . , 18A, and 18B, according some example embodiments of the present application, a vertical bipolar transistor may be implemented using the processes (or alternatively, operations) for forming a VTFET. Thus, the processes for forming a VTFET may be used to form the vertical bipolar transistor with no additional processes.

According to some example embodiment, a vertical bipolar transistor may have an E-B junction(s) in a well region provided in a semiconductor substrate, thereby obtaining E-B junction(s) having relatively stable electrical characteristics.

It should be understood that example embodiments described herein should be considered in a descriptive sense only and not for purposes of limitation. While some example embodiments have been particularly shown and described, it will be understood by one of ordinary skill in the art that variations in form and detail may be made therein without departing from the spirit and scope of the claims.

What is claimed is:

1. A vertical bipolar transistor comprising:
    a substrate including a first well of a first conductivity type and a second well of a second conductivity type, the second conductivity type being different from the first conductivity type, the first well adjoining the second well;
    a first fin extending from the first well, the first fin including a first conductive region at a top portion thereof, the first conductive region having the second conductivity type and configured to serve as an emitter of the vertical bipolar transistor;
    a second fin extending from the first well and spaced apart from the first fin, the second fin including a second conductive region at a top portion thereof, the second conductive region having the first conductivity type and configured to serve as a base of the vertical bipolar transistor;
    a third fin extending from the second well, the third fin including a third conductive region at a top portion thereof, the third conductive region having the second conductivity type and configured to serve as a collector of the vertical bipolar transistor; and
    a first sub-emitter region and a second sub-emitter region in the first well and at both sides of the first fin, the first sub-emitter region and the second sub-emitter region having the second conductivity type, the first sub-emitter region and the second sub-emitter region laterally spaced apart from each other, and the first sub-emitter region and the second sub-emitter region configured to function as the emitter together with the first conductive region.

2. The vertical bipolar transistor of claim 1, further comprising:
    a first isolation region in the first well and laterally between the first fin and the second fin, the first isolation region extending to a first depth in the first well, the first depth being shallower than a second depth of the first well.

3. The vertical bipolar transistor of claim 2, further comprising:
    a second isolation region at a boundary between the first well and the second well and laterally between the second fin and the third fin, the second isolation region extending to a third depth, the third depth being shallower than each of the first depth of the first well and a fourth depth of the second well.

4. The vertical bipolar transistor of claim 1, further comprising:
    a first isolation region at a boundary between the first well and the second well and laterally between the second fin and the third fin, the first isolation region extending to a first depth, the first depth being shallower than both a second depth of the first well and a third depth of the second well.

5. The vertical bipolar transistor of claim 1, further comprising at least one of:
    a first sub-base region and a second sub-base region in the first well and at both sides of the second fin, the first sub-base region and the second sub-base region having the first conductivity type, the first sub-base region and the second sub-base region laterally spaced apart from each other, and the first sub-base region and the second sub-base region configured to function as the base together with the second conductive region; or a first sub-collector region and a second sub-collector region in the second well and at both sides of the third fin, the first sub-collector region and the second sub-collector region having the second conductivity type, the first sub-collector region and the second sub-collector region laterally spaced apart from each other, and the second sub-collector region configured to function as the collector together with the third conductive region.

6. The vertical bipolar transistor of claim 1, wherein
the second conductive region has a shape surrounding the first conductive region in a plan view, and
the third conductive region has a shape surrounding the second conductive region in the plan view.

7. The vertical bipolar transistor of claim 6, wherein the first conductive region has a disk shape or a rectangular shape in the plan view.

8. The vertical bipolar transistor of claim 1, further comprising:
the first fin including a fourth conductive region, the fourth conductive region being a portion of the first fin under the first conductive region, and the fourth conductive region having the first conductivity type;
the second fin including a fifth conductive region, the fifth conductive region being a portion of the second fin under the second conductive region, and the fifth conductive region having the first conductivity type; and
the third fin including a sixth conductive region, the sixth conductive region being a portion of the third fin under the third conductive region, and the sixth conductive region having the second conductivity type.

9. A vertical bipolar transistor comprising:
a substrate including a first well of a first conductivity type and a second well of a second conductivity type, the second conductivity type being different from the first conductivity type, the first well adjoining the second well;
a first conductive region in the first well, the first conductive region having the second conductivity type, the first conductive region configured to serve as a emitter of the vertical bipolar transistor;
a first fin extending from the first well of the substrate, the first fin laterally spaced apart from the first conductive region, the first fin including a second conductive region at a top portion thereof, the second conductive region having the first conductivity type;
a second fin extending from the second well of the substrate, the second fin including a third conductive region at a top portion thereof, the third conductive region having the second conductivity type;
at least one sub-base region in the first well, the at least one sub-base region having the first conductivity type, the at least one sub-base region aligned with respect to the first fin and laterally spaced apart from the first conductive region, the second conductive region and the at least one sub-base region collectively configured to serve as a base of the vertical bipolar transistor; and
at least one sub-collector region in the second well, the at least one sub-collector region having the second conductivity type, the at least one sub-collector region aligned with respect to the second fin and laterally spaced apart from the at least one sub-base region, the third conductive region and the at least one sub-collector region collectively configured to serve as a collector of the vertical bipolar transistor.

10. The vertical bipolar transistor of claim 9, wherein the at least one sub-base region includes a first sub-base region and a second sub-base region, and the first sub-base region and the second sub-base region are laterally on opposite sides of the first fin.

11. The vertical bipolar transistor of claim 10, further comprising:
an isolation region in the first well and having a depth shallower than a depth of the first well, the isolation region being between the first conductive region and one of the first sub-base region and the second sub-base region that faces the first conductive region.

12. The vertical bipolar transistor of claim 10, wherein the at least one sub-collector region includes a first sub-collector region and a second sub-collector region, and the first sub-collector region and the second sub-collector region are laterally on opposite sides of the second fin.

13. The vertical bipolar transistor of claim 12, further comprising:
an isolation region is at a boundary between the first well and the second well and between (1) one of the first sub-base region and the second sub-base region and (2) one of the first sub-collector region and the second sub-collector region that face each other.

14. The vertical bipolar transistor of claim 13, wherein a depth of the isolation region is shallower than each of a depth of the first well and a depth of the second well.

15. The vertical bipolar transistor of claim 9, wherein the at least one sub-collector region includes a first sub-collector region and a second sub-collector region which are laterally on opposite sides of the second fin.

16. A vertical bipolar transistor comprising:
a first fin and a second fin extending from a first well of a substrate, the first well having a first conductivity type, the first fin and the second fin being spaced apart from each other, the first fin including a first conductive region having a second conductivity type at a top portion thereof, the second fin including a second conductive region having the first conductivity type at a top portion thereof, the first and second conductivity types being opposite to each other;
a third fin extending from a second well of the substrate, the second well having a second conductivity type, the second well adjoining the first well, the third fin including a third conductive region having the second conductivity type at a top portion thereof;
an emitter region of the vertical bipolar transistor including,
the first conductive region, and
at least one sub-emitter region in the first well and having the second conductivity type, the at least one sub-emitter region laterally aligned with respect to the first fin, the first conductive region and the at least one sub-emitter region collectively configured to serve as an emitter of the vertical bipolar transistor;
a base region of the vertical bipolar transistor including,
the second conductive region, and
at least one sub-base region in the first well and having the first conductivity type, the at least one sub-base region laterally aligned with respect to the second fin, the second conductive region and the at least one sub-base region collectively configured to serve as a base of the vertical bipolar transistor; and a collector region of the vertical bipolar transistor including, the third conductive region, and at least one sub-collector region in the second well and having the second conductivity type, the at least one sub-collector region laterally aligned with respect to the third fin, the third conductive region and the at least one sub-collector region collectively configured to serve as a collector of the vertical bipolar transistor.

17. The vertical bipolar transistor of claim 16, wherein the at least one sub-emitter region includes a first sub-emitter region and a second sub-emitter region which are laterally on opposite sides of the first fin, the at least one sub-base region includes a first sub-base region and a second sub-base region which are laterally on opposite sides of the second fin, and the at least one sub-collector region includes a first sub-collector region and a second sub-collector region which are laterally on opposite sides of the third fin.

18. The vertical bipolar transistor of claim 16, further comprising:

a first isolation region in the first well and laterally between the first fin and the second fin, a depth of the first isolation region being shallower than a depth of the first well.

19. The vertical bipolar transistor of claim 18, further comprising:

a second isolation region at a boundary between the first well and the second well and laterally between the second fin and the third fin.

20. The vertical bipolar transistor of claim 19, wherein a depth of the second isolation region is shallower than each of the depth of the first well and a depth of the second well.

* * * * *